US008564131B2

(12) United States Patent
Nakatani et al.

(10) Patent No.: US 8,564,131 B2
(45) Date of Patent: Oct. 22, 2013

(54) SEMICONDUCTOR DEVICE AND METHOD FOR MANUFACTURING THE SAME

(75) Inventors: Goro Nakatani, Kyoto (JP); Tatsuya Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/043,276

(22) Filed: Jan. 14, 2002

(65) Prior Publication Data
US 2002/0132392 A1 Sep. 19, 2002

(30) Foreign Application Priority Data

Jan. 15, 2001 (JP) .................................. 2001-6581

(51) Int. Cl.
*H01L 23/48* (2006.01)
*H01L 23/52* (2006.01)
*H01L 29/40* (2006.01)

(52) U.S. Cl.
USPC .......................................... 257/750; 257/758

(58) Field of Classification Search
USPC ............ 253/758, 759, 752, 58; 438/118, 622; 257/750–775, E23.142
See application file for complete search history.

(56) References Cited

U.S. PATENT DOCUMENTS

| 5,149,615 | A | * | 9/1992 | Chakravorty et al. | 430/313 |
| 5,169,680 | A | * | 12/1992 | Ting et al. | 438/629 |
| 5,818,071 | A | * | 10/1998 | Loboda et al. | 257/77 |
| 6,084,304 | A | * | 7/2000 | Huang et al. | 257/762 |
| 6,207,553 | B1 | * | 3/2001 | Buynoski et al. | 438/622 |
| 6,218,302 | B1 | * | 4/2001 | Braeckelmann et al. | 438/687 |
| 6,399,489 | B1 | * | 6/2002 | M'Saad et al. | 438/680 |
| 6,410,414 | B1 | * | 6/2002 | Lee | 438/612 |
| 6,441,467 | B2 | * | 8/2002 | Toyosawa et al. | 257/637 |
| 6,476,491 | B2 | * | 11/2002 | Harada et al. | 257/758 |

FOREIGN PATENT DOCUMENTS

| JP | 63-045835 A | 2/1988 |
| JP | 04-196251 A | 7/1992 |
| JP | 4-316339 | 11/1992 |
| JP | 5-152448 | 6/1993 |
| JP | 9-64050 | 3/1997 |
| JP | 11-54508 A | 2/1999 |
| JP | 11-260916 A | 9/1999 |
| JP | 2000-195891 A | 7/2000 |
| JP | 2000-243774 A | 9/2000 |

\* cited by examiner

*Primary Examiner* — Cuong Q Nguyen
(74) *Attorney, Agent, or Firm* — Morgan, Lewis & Bockius LLP

(57) ABSTRACT

The invention is characterized in including interconnect layer formed on surface of a substrate forming desired element region, inter layer dielectric covering surface of said interconnect layer, silicon nitride film formed so as covering whole surface of said inter layer dielectric, metal interconnect layer consisting of gold layer as the uppermost lay metal formed on the upper layer of said silicon nitride film, and planarized dielectric formed on said metal interconnect layer.

12 Claims, 3 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device, particularly to the uppermost layer interconnect and passivation structure thereof.

2. Description of the Related Art

Various kinds of techniques are known for planarizing an upper surface of interconnect the dielectric film that are employed between the metal layers, so-called intermetal dielectric, at manufacturing a semiconductor device of VLSI (Very Large Scale Integrated Circuit) and the like. The semiconductor device manufactured using the conventional technique planarizing interconnect dielectric is shown in FIG. 6.

According to the conventional method for manufacturing, first, an object forming field oxide film 2 on a semiconductor substrate 1 is prepared and a MOSFET (Metal-Oxide-semiconductor Field Effect Transistor) having a poly silicon gate 5 is formed on the field oxide film 2 and semiconductor substrate 1 as shown in FIG. 6.

Next, ILD (Inter Layer Dielectric) 3 is formed so as covering them. The inter layer dielectric 3 consists of PSG (Silicon oxide doping Phosphorus) or BPSG (Silicon oxide doping Boron and Phosphorus). Next, aluminum interconnect 4 is formed on the inter layer dielectric 3.

By depositing USG (Silicon glass not doped) using CVD method (Vapor phase epitaxy method) and the like, USG layer 6 is formed.

Next, after forming aluminum interconnect 7s as the uppermost layer metal interconnect, and forming passivation film and PSG (Silicon oxide doping Phosphorus) or BPSG (Silicon oxide doping Boron and Phosphorus) 8, SOG film 8s is formed so as to planarized surface.

Thus, although planarizing of the surface is carried out with forming the passivation film, there are problems that passivation film of enough film thickness must be formed to protect completely aluminum interconnect of foundations and that it takes time for forming film.

Moreover, bonding is need for the uppermost layer interconnect and it needs to form an electrode pat superior in bonding resist. Therefore, it is need that only a part of the bonding pad is formed separately or that thickness of film is made thick enough at the case forming it on the same process. Therefore, roughness of the surface is made large, so there is a problem that planarizing process of the passivation film forming on the upper layer is difficult.

Further more, in the SOG process, many process and operations are need. For example, before removing unnecessary part by etching-back after applying SOG layer, measuring process of thickness of film of the applied SOG layer and annealing process of the applied SOG layer, and in the etching-back process of the SOG layer, operation of measuring thickness of the remained film is need. Moreover, after the etching-back process, $O_2$ plasma processing process, scrubber process using a brush, and so on are need. Further more, although silicon compound (generally $R_nSi(OH)_{4-n}$) is used for insulation material, there is a problem that it is comparatively expensive.

As described above, in the conventional interconnect structure, there are problems such that manufactureability is low or it is difficult to keep reliability.

SUMMARY OF THE INVENTION

An object of the invention is to provide a method for manufacturing a semiconductor device forming a interconnect structure installing a passivation structure having a flat upper surface which is easy to manufacture and is superior in insulation performance with low cost and short lead time in order to solve these problems.

Moreover, an another object is to provide a interconnect structure in which interconnect resistance is small and bonding resist is high.

Then, the first invention is characterized in including interconnect layer formed on surface of a substrate forming desired element region, inter layer dielectric covering surface of said interconnect layer, silicon nitride film formed so as covering whole surface of said inter layer dielectric, metal interconnect layer consisting of gold layer as the uppermost lay metal formed on the upper layer of said silicon nitride film, and planarized dielectric formed on said metal interconnect layer.

According to its structure, as the metal interconnect layer of the uppermost layer is structured with gold, the interconnect layer can be made low resistance and thin in film thickness thereof so that planarizing surface is easy.

As the metal interconnect layer of the uppermost layer is structured with gold, humidity resistance can be made high and it is possible to simplify passivation structure comparing with that of the conventional interconnect such as aluminum interconnect. Surface of the inter layer dielectric of foundation is protected by silicon nitride film. In the region where a through hole is formed on the silicon nitride film, its surface is covered with metal layer as the uppermost layer metal interconnect layer, therefore, protection of the lower layer interconnect region and the semiconductor element region is perfect.

As the inter layer dielectric such as USG film is covered with silicon nitride film, it is fine to film thickness and passivation effect is high. Therefore, the passivation film formed on the upper layer may be an object low in passivation effect. Therefore, the passivation film is only polyimide film and it is possible to obtain planarized structure easily and in short time.

Further, the invention is characterized by said planarized dielectric made of polyimide.

It is possible to form thick film in film thickness extremely easily by applying process because polyimide is used for the planarized film.

As the metal interconnect of the uppermost layer is structured with gold layer, enough passivation effect can be obtained even if polyimide is formed directly. Further, it is possible to use the metal interconnect directly as a bonding pad.

Further, the invention is characterized by said silicon nitride film being formed by high-density plasma CVD method.

According to the method, fine film can be formed by forming the inter layer dielectric by vapor phase epitaxial method using high-density plasma superior in embedding facility. Moreover, inter layer dielectric which is planarized at the upper face can be formed efficiently.

Further, the invention is characterized by polyimide resin layer being removed at a part of region of said metal interconnect layer and bonding wire is connected to said region in said metal interconnect layer.

According to the structure, by removing polyimide only at necessary region of periphery and carrying out bonding, it is possible to decrease sharply probability of occurrence of shortage and to design improvement of yield.

At direct bonding, forming a bump is very easy by forming a through hole at polyimide film using photolithography method and carrying out gold selective plating.

As high SOG process in production cost can be omitted, production cost can be decreased. Lead time for production can be shortened. Therefore, cost required for forming interconnect intermetal dielectric can be decreased and shortening of production lead time can be designed.

That is, it is possible to form inter layer dielectric having flat upper face superior in insulation performance with low cost and short lead time.

DESCRIPTION OF THE PREFERRED EMBODIMENTS

Figure 1:
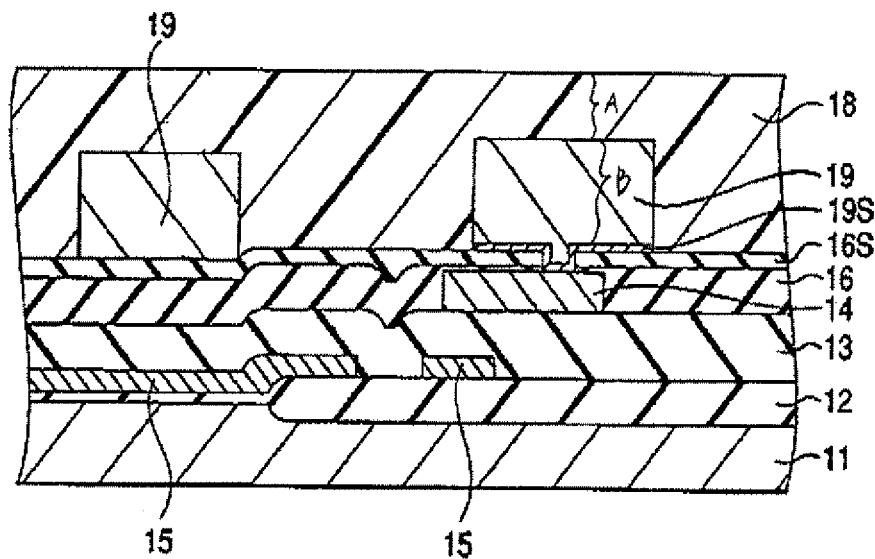
FIG. 1 is a view showing a semiconductor device according to a mode for carrying out the invention.

FIG. 1 is a main part view showing a semiconductor device according to a mode for carrying out the invention. FIGS. 2 to 5 show a part of sectional structure of semiconductor at each manufacturing process.

The semiconductor device forms a MOSFET (Metal Oxide Semiconductor Field Effect Transistor) having a poly silicon gate 15 on a silicon substrate 11 forming a field oxide film as shown in FIG. 1.

That is, the semiconductor is characterized in including a first interconnect layer 14 consisting of aluminum formed on surface of a silicon substrate 11 forming desired element region, inter layer dielectric 16 consisting of USG film covering surface of said first interconnect layer 14, silicon nitride film 16s formed by plasma CVD method as covering whole surface of said inter layer dielectric 16, metal interconnect layer 19 consisting of gold layer as the uppermost lay metal formed on the upper layer of said silicon nitride film 16s, and planarized dielectric 18 consisting of polyimide film formed on said metal interconnect layer 19. Between the metal interconnect layer 19 and the first interconnect layer 14, barrier layer 19s consisting of thin titanium film in order to prevent migration of aluminum is stood.

Field oxide film 12 is formed on the silicon substrate 11, the MOSFET having the poly silicon gate 15 is formed, and inter layer dielectric 13 is formed as covering this. The inter layer dielectric 13 consists of PSG (silicon oxide film doping phosphorus) or BPSG (silicon oxide film doping boron and phosphorus) for example.

Next, the manufacturing process of the semiconductor device will be described.

Figure 2:
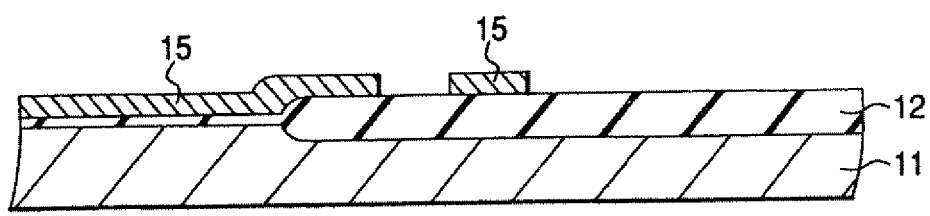
FIG. 2 is a view showing a method for manufacturing a semiconductor device according to the mode for carrying out the invention.

First, with forming an element region by forming element separation film 12 on surface of a silicon substrate 11, a MOSFET having gate interconnect 15 consisting of poly silicon film in the element region as shown in FIG. 2.

Figure 3:
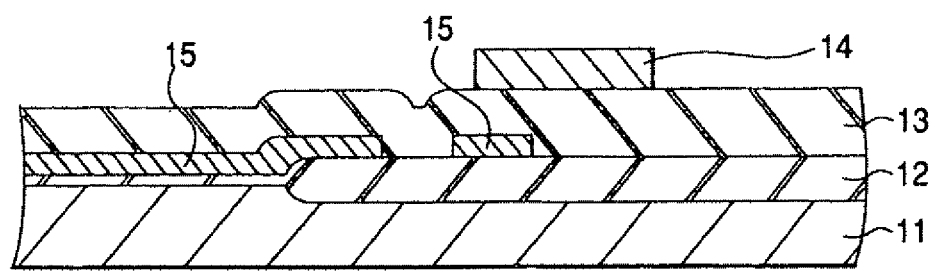
FIG. 3 is a view showing a method for manufacturing a semiconductor device according to the mode for carrying out the invention.

Inter layer dielectric 13 consisting of BPSG film is formed on the upper layer and a first interconnect layer 14 connecting to the gate interconnect through a contacting hole not shown is formed as shown in FIG. 3.

Figure 4:
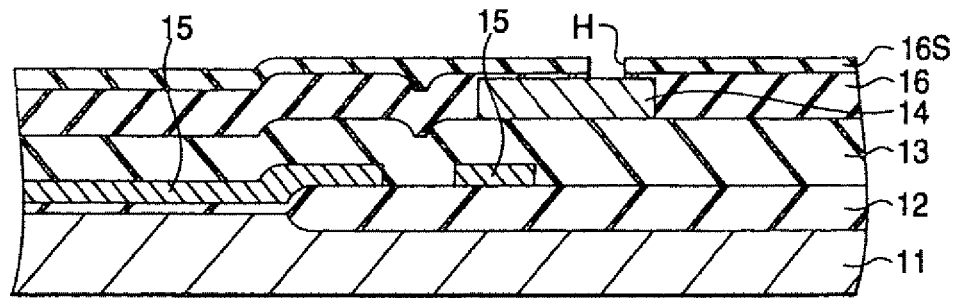
FIG. 4 is a view showing a method for manufacturing a semiconductor device according to the mode for carrying out the invention.

After that, USG layer 16 is formed by depositing USG (silicon glass not doped) by CVD method (Vapor phase epitaxy method) and the like, further silicon nitride film 16s is formed on the upper layer by plasma CVD method as shown in FIG. 4.

A contacting hole H for forming metal interconnect of the uppermost layer is formed.

Figure 5:
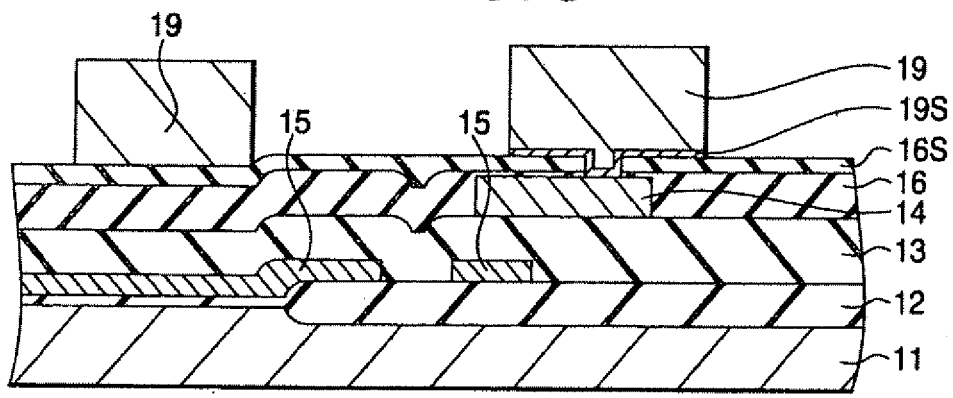
FIG. 5 is a view showing a method for manufacturing a semiconductor device according to the mode for carrying out the invention.
Figure 6:
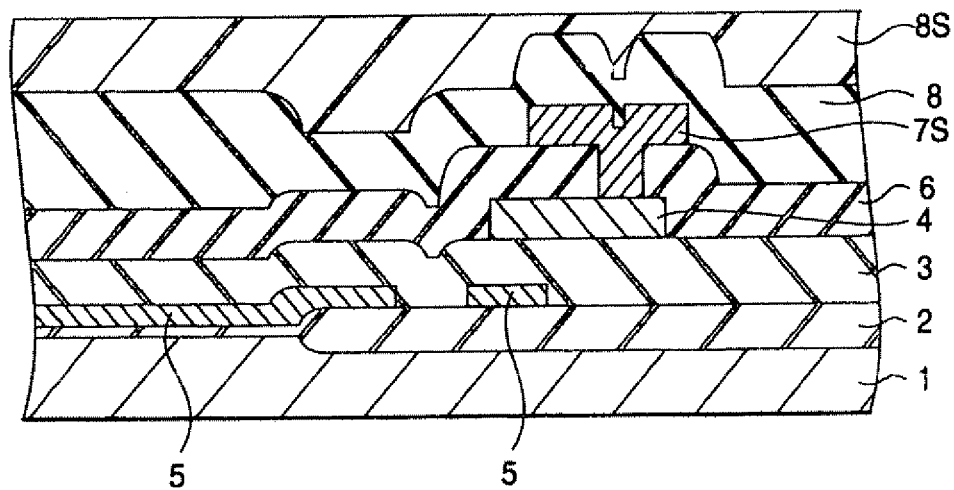
FIG. 6 is a view showing the conventional semiconductor device.

After that, metal interconnect 19 consisting of gold layer is formed after forming titanium thin film for barrier layer 19s by spattering method as shown in FIG. 5.

After that, passivation film 18 consisting of polyimide film of two microns film thickness is formed by applying method.

Thus, the semiconductor device shown in FIG. 1 is formed.

According such the structure, bonding facility is superior, resistance is low, and reliability is high as the metal interconnect layer of the uppermost layer is structured with gold layer. Further, as thickness of film of the interconnect layer can be made thin, it is easy to planarize the surface.

AS the metal interconnect layer of the uppermost layer is structured by gold, humidity resistance can be made high and it is possible to simplify passivation structure comparing with the conventional interconnect such as aluminum interconnect. Surface of the inter layer dielectric of foundation is protected by silicon nitride film formed using plasma CVD method and it is fine so as to be superior in passivation effect even it is thin.

As film thickness is thin, roughness of the upper layer is small so that planarizing process is easy.

In the region where the through hole is formed on the silicon nitride film, surface thereof is covered with metal layer as the uppermost layer metal interconnect layer, therefore, protection effect of the lower layer interconnect region and the semiconductor element region is high and reliability is high.

As the inter layer dielectric such as USG film is covered with silicon nitride film, it is fine in film thickness and passivation effect is high. The passivation film formed on the upper layer may be an object low in passivation effect. Therefore, the passivation film is only polyimide film and it is possible to obtain planarized structure easily and in short time.

It is possible to form thick film in film thickness extremely easily by applying process because polyimide is used for the planarized film.

As the metal interconnect of the uppermost layer is structured with gold layer, enough passivation effect can be obtained even if polyimide is formed directly. Further, it is possible to use the metal interconnect directly as a bonding pad.

Fine film can be formed by forming the inter layer dielectric with vapor phase epitaxy method using high-density plasma superior in embedding facility. Inter layer dielectric flat at the upper face can be formed efficiently.

By removing polyimide only at necessary region of periphery and carrying out bonding, it is possible to decrease sharply probability of occurrence of shortage and to design improvement of yield.

At direct bonding, forming a bump is very easy by forming a through hole at polyimide film using photolithography method and carrying out gold selective plating. As periphery of the bump is polyimide film, it is elastic and bonding is easy.

As high SOG process in production cost can be omitted, production cost can be decreased. Lead time for production can be shortened so that cost required for forming interconnectintermetal dielectric can be decreased. Further, shortening of production lead time can be designed.

That is, it is possible to form inter layer dielectric having flat upper face superior in insulation performance with low cost and short lead time.

For the inter layer dielectric, PSG (silicon oxide film doping phosphorus) and USG film are applicable except BPSG.

Silicon nitride may be formed by high density plasma CVD method after applying organic SOG layer structured with organic dielectric (organic SOG) consisting of silicon compound easily forming thickness on the deposited USG layer using SOG (Spin On Glass) method and embedding concave portion of the upper face of the USG layer.

As the high density plasma CVD method is good in embedding performance, it is possible that the upper face of the USG layer is kept flat and that the concave portion is embedded.

After that, interconnectintermetal dielectric having a structure surrounding SOG layer with good USG layer in film quality and being high insulation performance is formed after washing process, SOG annealing process, and so on.

The high density plasma CVD method can carry out forming film by CVD method and etching by spattering at the same time so as to carry out film forming superior in embedding performance. For plasma source of the high-density plasma CVD apparatus, an object using ECR (electron cyclotron resonance), ICP (inductively coupled plasma), and so on are known.

The high-density plasma CVD apparatus uses the ICP (inductively coupled plasma) for the plasma source. The high-density plasma CVD apparatus has a ceramic dome of hemisphere shape, and at outer circumference of the ceramic dome, coil structured with copper is arranged. The coil is applied with low frequency power of about 300 kHz to 2 MHz. High density plasma ($10^{11}$ to $10^{12}$ [ions/cm$^3$]) is formed by inductively coupled energy based on the low frequency power.

The SOG process high in production cost can be replaced with applying process of polyimide film. Because of that, production cost can be decreased according to needlessness of process forming the SOG process and lead-time required for production can be shortened. Therefore, it is possible to decrease cost required for forming inter layer dielectric and to shorten production lead-time.

That is, it is possible to form inter layer dielectric having a flat upper face superior in insulation performance with low cost and short lead-time.

Although interconnect layer of the MOSFET structured with the field oxide film and the aluminum interconnect formed thereon as foundation layer is described for example in the above-mentioned mode for carrying out, foundation layer is not limited to this. The foundation layer in the invention means whole conductive layer having surface of convex and concave shape. According to the invention, by using gold for the uppermost layer metal interconnect and forming silicon nitride film on inter layer dielectric, passivation effect is made high, therefore, it is possible to provide a semiconductor device easy in manufacturing and high in reliability.

What is claimed is:

1. A semiconductor device, comprising:
   a first interconnect layer disposed over a substrate where a functional semiconductor device is formed;
   an inter layer dielectric directly covering a portion of top surface and side surfaces of said first interconnect layer;
   a silicon nitride film formed so as to cover entirely a top surface of said inter layer dielectric;
   a metal interconnect layer covering said silicon nitride film, said metal interconnect layer being consisted of gold material and serving as a bonding pad;
   a passivation film which is formed directly on a surface of the silicon nitride film, directly and entirely surrounding the metal interconnect layer including a surface and a side wall thereof, and
   a barrier layer disposed between the metal interconnect layer and the first interconnect layer including on inner surface of a through hole that is formed on the silicon nitride film, and thickness of the barrier layer being equivalent at least on the inner surface of the through hole,
   wherein a portion of the passivation film is removed at a part of a region of the surface of the metal interconnect layer, thereby the part of the region of the surface of the metal interconnect layer is exposed from the passivation film, and a bonding wire is connected to the exposed part of the region of the surface of the metal interconnect layer,
   wherein a projection area of said region connected with the bonding wire is overlapped with said functional semiconductor device, and
   wherein the inter layer dielectric includes a first inter layer dielectric formed on the first interconnect layer and a second inter layer dielectric formed on a periphery of the first interconnect layer, and the first inter layer dielectric is thinner than the second inter layer dielectric.

2. A semiconductor device according to claim 1, wherein said silicon nitride film is formed by high-density plasma CVD method.

3. The semiconductor device of claim 1, wherein the passivation film is removed only at the part of the region of the surface of the metal interconnect layer, thereby the metal interconnect layer includes a part of the surface exposed from the passivation film and a part of the surface coated with the passivation film.

4. The semiconductor device of claim 1, wherein the passivation film is formed as a thin structure with a thickness of two microns.

5. A semiconductor device, comprising:
   a first interconnect layer covering a first portion of a surface of a functional semiconductor device;
   an inter layer dielectric covering a second portion of the surface of the semiconductor region and directly covering a portion of top surface and side surfaces of said first interconnect layer, thereby defining a contacting hole on the surface of the first interconnect layer;
   a silicon nitride film covering an entire top surface of said inter layer dielectric around the contacting hole on the surface of the first interconnect layer;
   a barrier layer covering the contacting hole and a portion of a surface of the silicon nitride film around the contacting hole, thereby forming a harrier layer region;
   a metal interconnect layer consisting of gold material covering the barrier layer region, thereby forming a metal interconnect region and serving as a bonding pad;
   a passivation film which is formed directly on a surface of the silicon nitride film, directly and entirely surrounding the metal interconnect layer including a surface and a side wall thereof, and
   a barrier layer disposed between the metal interconnect layer and the first interconnect layer including on inner surface of a through hole that is formed on the silicon nitride film, and thickness of the barrier layer being equivalent at least on the inner surface of the through hole, wherein a portion of the passivation film is removed at a part of a region of the surface of the metal interconnect layer, thereby the part of the region of the surface of the metal interconnect layer is exposed from the passivation film, and a bonding wire is connected to the exposed part of the region of the surface of the metal interconnect layer, wherein a projection area of said region connected with the bonding wire is overlapped with said functional semiconductor device, and wherein the inter layer dielectric includes a first inter layer dielectric formed on the first interconnect layer and a second inter layer dielectric formed on a periphery of the first interconnect layer, and the first inter layer dielectric is thinner than the second inter layer dielectric.

6. The semiconductor device of claim 5, wherein the barrier layer consists of titanium.

7. The semiconductor device of claim 6, wherein the first interconnect layer consists of aluminum.

8. The semiconductor device of claim 5, wherein the first interconnect layer consists of aluminum.

9. The semiconductor device of claim 5, wherein the second inter layer dielectric consists of USG film.

10. The semiconductor device of claim 5, wherein the functional semiconductor region further comprises a polysilicon gate isolated from the first interconnect layer by a third dielectric layer, wherein the first interconnect layer is connected to the polysilicon gate through a containing area disposed within the third dielectric layer.

11. The semiconductor device of claim 5, wherein the passivation film is removed only at the part of the region of the surface of the metal interconnect layer, thereby the metal interconnect layer includes a part of the surface exposed from the passivation film and a part of the surface coated with the passivation film.

12. The semiconductor device of claim 5, wherein the passivation film is formed as a thin structure with a thickness of two microns.

* * * * *